(12) United States Patent
Han et al.

(10) Patent No.: US 10,714,704 B2
(45) Date of Patent: Jul. 14, 2020

(54) FOLDABLE DISPLAY DEVICE AND METHOD OF MANUFACTURING THE SAME

(71) Applicant: LG DISPLAY CO., LTD., Seoul (KR)

(72) Inventors: Jonghyun Han, Paju-Si (KR); MiRae Lee, Busan (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/176,795

(22) Filed: Oct. 31, 2018

(65) Prior Publication Data

US 2019/0148667 A1    May 16, 2019

(30) Foreign Application Priority Data

Nov. 10, 2017  (KR) .................. 10-2017-0149943

(51) Int. Cl.
| | |
|---|---|
| G09G 5/00 | (2006.01) |
| H01L 51/52 | (2006.01) |
| G09F 9/30 | (2006.01) |
| H01L 51/56 | (2006.01) |
| H01L 27/32 | (2006.01) |
| G06F 3/041 | (2006.01) |
| H01L 27/12 | (2006.01) |
| H01L 51/00 | (2006.01) |

(52) U.S. Cl.
CPC ........ *H01L 51/5246* (2013.01); *G06F 3/0412* (2013.01); *G09F 9/301* (2013.01); *H01L 27/1248* (2013.01); *H01L 27/323* (2013.01); *H01L 27/3246* (2013.01); *H01L 27/3276* (2013.01); *H01L 51/5203* (2013.01); *H01L 51/5253* (2013.01); *H01L 51/56* (2013.01); *G06F 2203/04102* (2013.01); *H01L 51/0097* (2013.01); *H01L 2251/5338* (2013.01)

(58) Field of Classification Search
CPC ...................................................... G06F 3/02;
G06F 3/041; G06F 3/045; G09G 5/00;
G01R 27/26
See application file for complete search history.

(56) References Cited

U.S. PATENT DOCUMENTS

| | | | | |
|---|---|---|---|---|
| 2017/0099741 | A1* | 4/2017 | Shin | ............ H05K 5/0017 |
| 2017/0358637 | A1* | 12/2017 | Lee | ............ H01L 27/3251 |
| 2018/0033832 | A1* | 2/2018 | Park | ............ H01L 51/107 |
| 2018/0033834 | A1* | 2/2018 | Jun | ............ G06F 3/0412 |
| 2018/0164931 | A1* | 6/2018 | Na | ............ G06F 3/0412 |

* cited by examiner

*Primary Examiner* — Pegeman Karimi
(74) *Attorney, Agent, or Firm* — Birch, Stewart, Kolasch & Birch, LLP

(57) ABSTRACT

Discussed is a foldable device including a first flexible substrate, a touch unit under the first flexible substrate, a second flexible substrate facing the first flexible substrate, a light-emitting element unit on the second flexible substrate, and an adhesive layer for attaching the first flexible substrate and the second flexible substrate together. The touch unit includes a first touch wiring layer under the first flexible substrate, a first insulating layer covering the first touch wiring layer and the first flexible substrate, a second touch wiring layer under the first insulating layer, and a second insulating layer covering the second touch wiring layer and the first insulating layer. The second insulating layer includes an opening for exposing a part of an edge of the first insulating layer to the adhesive layer.

20 Claims, 11 Drawing Sheets

FOLDABLE DISPLAY DEVICE AND METHOD OF MANUFACTURING THE SAME

CROSS-REFERENCE TO RELATED APPLICATIONS

This application claims the priority of Korean Patent Application No. 10-2017-0149943 filed on Nov. 10, 2017, in the Korean Intellectual Property Office, the disclosure of which is incorporated herein by reference in its entirety.

BACKGROUND

Technical Field

The present disclosure relates to a foldable display device and a method of manufacturing a foldable display device, and more particularly to a foldable display device that can suppress an adhesive layer from overflowing, and a method of manufacturing a foldable display device.

Description of the Related Art

As the era of information technology has begun, the field of display that represents electrical information signals graphically has rapidly grown. In accordance with this, various display devices which are thinner, lighter and consume less power have been developed.

Examples of such display devices include a liquid-crystal display (LCD) device, a plasma display panel (PDP) device, a field emission display (FED) device, and an organic light-emitting display (OLED) device, etc.

In particular, an OLED device is implemented without a separate light source device, and thus it is easy to implement an OLED device as a flexible display device. In a flexible display device, a flexible material such as plastic and metal foil is used for the substrate of the flexible display device.

Among flexible display devices, there is an increasing demand for a foldable display device that can be folded so as to increase the efficiency of the space utilization for storage or to allow the display areas to be viewed from both sides.

In a foldable display device, a touch unit for sensing a touch can be folded as well. For example, an existing foldable display device can be fabricated as follows: a flexible substrate is formed on a glass substrate, and then a touch unit for touch sensing is formed. A light-emitting element unit for displaying an image is formed on another flexible substrate. Subsequently, the glass substrate on which the touch unit is formed and the flexible substrate on which the light-emitting element unit is formed can be attached together by using a fluid adhesive. The adhesive is cured to become an adhesive layer, and then the glass substrate is removed from the flexible substrate on which the touch unit is formed by laser irradiation. Accordingly, only the flexible substrates remain on both the upper and lower portions of the display device, thereby allowing the display device to be folded.

If the adhesive overflows during the process of attaching the touch unit and the light-emitting element unit by using the adhesive, the adhesive layer can be formed in the portion to be cut by the laser. If the adhesive layer is formed on the portion to be cut by the laser, there can be a problem that the glass substrate is not easily separated. For example, if the glass substrate is forcibly peeled off, a part of the glass substrate is broken due to the adhesive force of the adhesive layer, such that fragments can act as foreign substances. As a result, it can be difficult to manufacture display devices reliably. If a lesser amount of the adhesive is used in order to suppress overflowing, the adhesive can fail to reach a predetermined position. As a result, a portion where the adhesive is not formed can be broken together during the laser cutting, and a part of the touch unit can be exposed.

SUMMARY OF THE INVENTION

In view of the above, the inventors of the application have recognized that by using a structure for suppressing the adhesive from spreading too much or too little, it is possible to ensure that an adhesive spreads without going beyond the portion to be cut by a laser when a predetermined amount of the adhesive is used.

In view of the above, an object of the present disclosure is to provide a foldable display device that can restrict the overflow of an adhesive layer when a touch unit and a light-emitting element unit are attached together by using the adhesive layer.

Objects of the present disclosure are not limited to the above-mentioned objects, and other objects, which are not mentioned above, can be clearly understood by those skilled in the art from the following descriptions.

According to an aspect of the present disclosure, there is provided a foldable display device. The foldable display device includes a first flexible substrate, a touch unit under the first flexible substrate, a second flexible substrate facing the first flexible substrate, a light-emitting element unit on the second flexible substrate, and an adhesive layer for attaching the first flexible substrate and the second flexible substrate together. The touch unit includes a first touch wiring layer under the first flexible substrate, a first insulating layer covering the first touch wiring layer and the first flexible substrate, a second touch wiring layer under the first insulating layer, and a second insulating layer covering the second touch wiring layer and the first insulating layer. The second insulating layer includes an opening for exposing a part of an edge of the first insulating layer to the adhesive layer.

According to another aspect of the present disclosure, there is provided a method of manufacturing a foldable display device, the method comprising: forming a first flexible substrate on a rigid substrate; forming a touch unit on the first flexible substrate; forming a light-emitting element unit on a second flexible substrate; applying an adhesive over the touch unit on the first flexible substrate; attaching the first flexible substrate and the second flexible substrate together; and separating the rigid substrate from the first flexible substrate. The forming the touch unit includes forming a first touch wiring layer on the first flexible substrate, forming a first insulating layer covering the first touch wiring layer and the first flexible substrate, forming a second touch wiring layer on the first insulating layer, and forming a second insulating layer covering the second touch wiring layer and the first insulating layer such that it has an opening via which a part of an edge of the first insulating layer is exposed to the adhesive layer According to an example embodiment of the present disclosure, it is possible to suppress an adhesive from spreading too much or too little when a touch unit and the light-emitting element unit are attached together by using the adhesive.

More specifically, by forming an opening in an insulating layer at the top of the touch unit, it is possible to restrict overflow of the adhesive when the touch unit and the light-emitting element unit are attached to by using the adhesive.

According to a variety of example embodiments of the present disclosure, it is ensured that an adhesive does not spread beyond a portion to be cut by a laser, so that a rigid substrate can be separated easily, thereby manufacturing a foldable display device reliably with reduced defects due to breakage.

Further, according to a variety of example embodiments of the present disclosure, it is ensured that an adhesive layer is restricted as desired, so that it is possible to avoid breakage at a portion where the adhesive is not formed during the process of cutting by a laser, and to suppress defects that a part of the touch unit is exposed.

Other detailed matters of the example embodiments are included in the detailed description and the drawings.

The foldable display device and the method of manufacturing a foldable display device according to a variety of example embodiments of the present disclosure can restrict the overflow of the adhesive layer when the touch unit and the light-emitting element unit are attached together by forming a plurality of holes in the insulating layer at the top of the touch unit.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
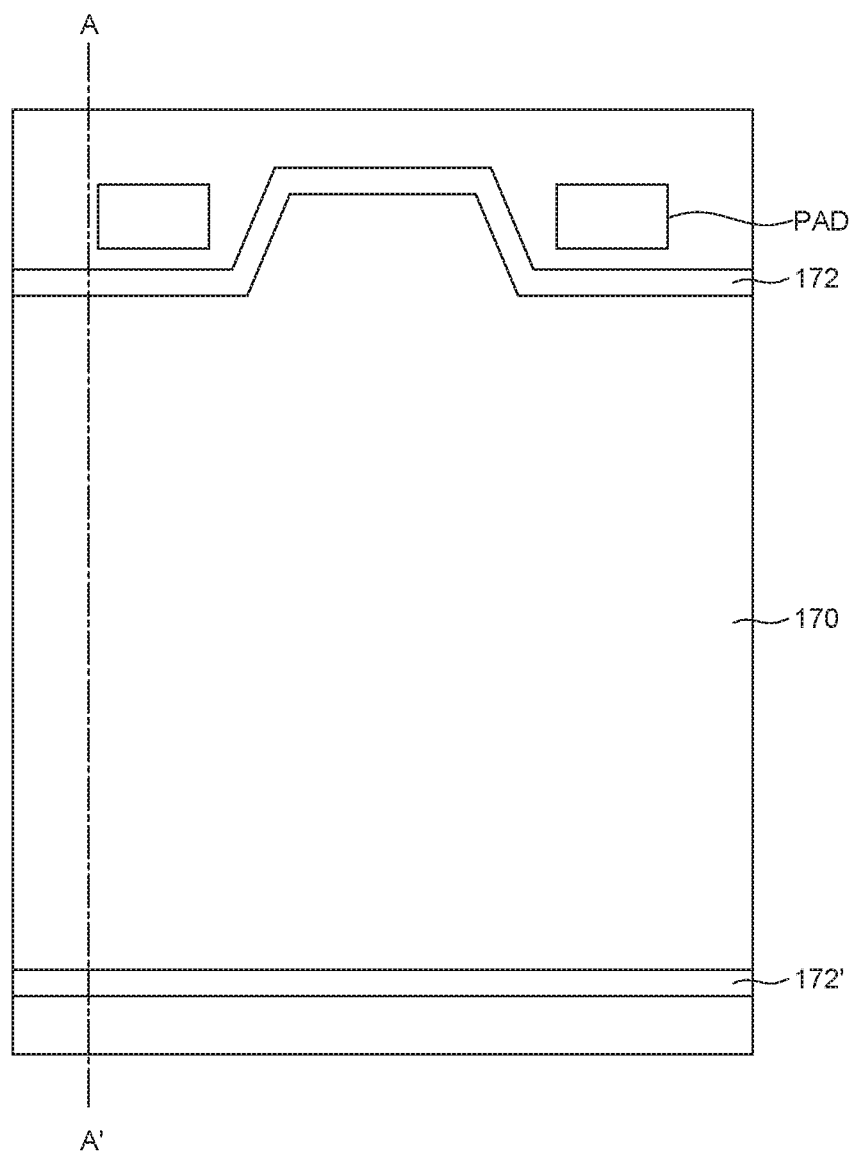
FIG. 1 is a plan view of a touch unit of a foldable display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to the accompanying drawings.

Advantages and features of the present disclosure and methods to achieve them will become apparent from the descriptions of example embodiments herein below with reference to the accompanying drawings. However, the present disclosure is not limited only to the example embodiments.

Figure 2:
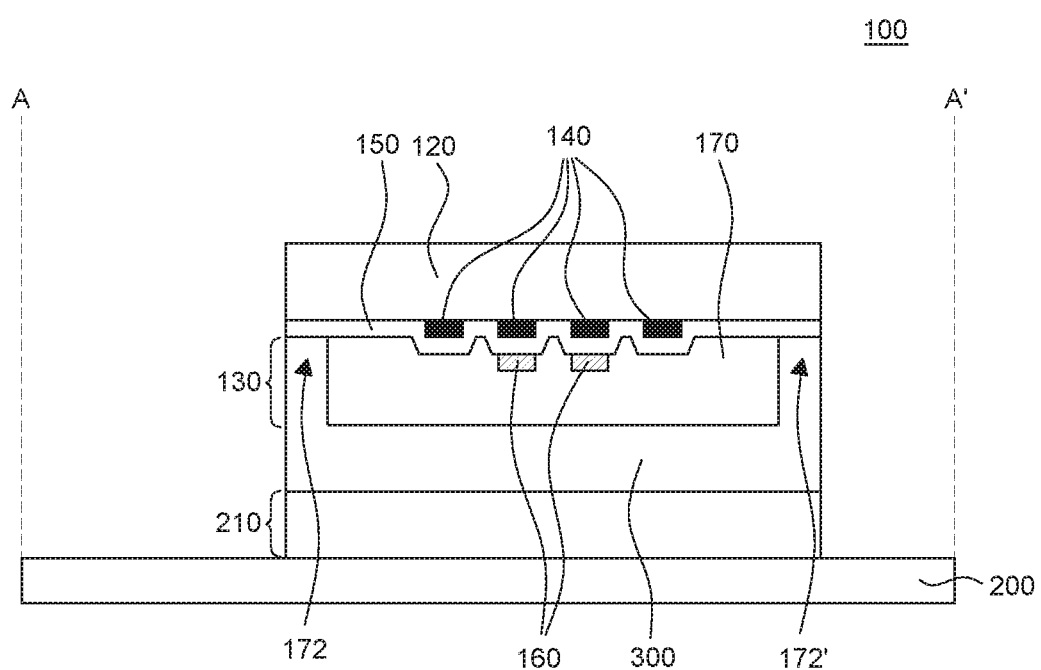
FIG. 2 is a cross-sectional view of a foldable display device according to an example embodiment of the present disclosure, taken along line A-A' of FIG. 1.
Figure 3:
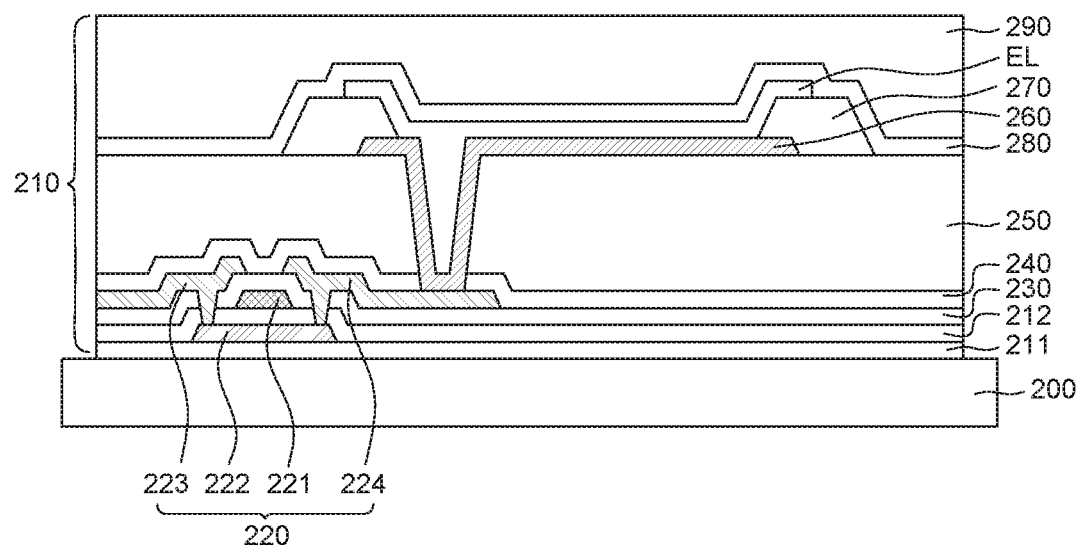
FIG. 3 is a cross-sectional view of a light-emitting element unit facing a touch unit of a foldable display device according to an example embodiment of the present disclosure.

FIG. 1 is a plan view of a touch unit of a foldable display device according to an example embodiment of the present disclosure. FIG. 2 is a cross-sectional view of a foldable display device according to an example embodiment of the present disclosure, taken along line A-A' of FIG. 1. FIG. 3 is a cross-sectional view of a light-emitting element unit facing a touch unit of a foldable display device according to an example embodiment of the present disclosure.

Referring to FIGS. 1 to 3, a foldable display device 100 can include a first flexible substrate 120, a touch unit 130 under the first flexible substrate 120, a second flexible substrate 200 facing the first flexible substrate 120, a light-emitting element unit 210 on the second flexible substrate 200, and an adhesive layer 300 for attaching the first flexible substrate 120 and the second flexible substrate 200 together. All the components of the foldable display device 100 according to all embodiments of the present disclosure are operatively coupled and configured.

The first flexible substrate 120 can be made of a plastic material having flexibility. For example, the first flexible substrate 120 can be formed of, but is not limited to, an organic insulating material such as poly aluminum chloride, photo-acryl, acrylate and polyamide. Other variations are possible. According to a variety of example embodiments of the present disclosure, a pad PAD can be disposed outside the first flexible substrate 120, and the upper surface of the pad PAD can have the same level as the upper surface of the first flexible substrate 120. The pad PAD can be connected to a first touch wiring layer 140 and a second touch wiring layer 160 through a routing wiring. A touch signal generated at a touch electrode can be transmitted to the pad PAD through the routing wiring. For example, the pad PAD can be formed of a low resistance metal and/or a transparent conductive oxide (TCO) material.

The touch unit 130 can be disposed under the first flexible substrate 120. The touch unit 130 includes the first touch wiring layer 140, a first insulating layer 150, the second touch wiring layer 160, and a second insulating layer 170.

The first touch wiring layer 140 can include wirings arranged in the first direction. According to a variety of example embodiments of the present disclosure, the first touch wiring layer 140 can include the wirings in the first direction as well as the wirings in the second direction electrically isolated from each other.

The first insulating layer 150 can be configured to cover the first flexible substrate 120 and the first touch wiring layer 140. The first insulating layer 150 can be a protective layer for protecting the first touch wiring layer 140. When the first touch wiring layer 140 and the second touch wiring layer 160 are formed of a metal, the first insulating layer 150 can be formed of an inorganic material such as silicon nitride (SiNx), aluminum oxide (Al$_2$O$_3$) and silicon oxide (SiOx) for preventing oxidation of the metal.

The second touch wiring layer 160 can be formed on the first insulating layer 150. In FIG. 2, the second touch wiring layer 160 is shown as being disposed on the back surface of the first insulating layer 150. According to a variety of example embodiments of the present disclosure, a bridge wiring can be formed in the second touch wiring layer 160 for electrically connecting a portion with another as desired. Alternatively, in a variety of example embodiments of the present disclosure, the wiring layer 160 can include wiring layers arranged in the second direction different from the first direction.

A second insulating layer 170 covering the second touch wiring layer 160 and the first insulating layer 150 can be disposed under the second touch wiring layer 160. The second insulating layer 170 can be a planarizing layer for providing a flat surface under the first insulating layer 150 and the second touch wiring layer 160. Alternatively, when the first touch wiring layer 140 and the second touch wiring layer 160 are formed of a metal, the second insulating layer 170 can be formed of an inorganic material such as silicon nitride (SiNx), aluminum oxide (Al$_2$O$_3$) and silicon oxide (SiOx) for preventing oxidation of the metal. A contact hole can be formed in the first insulating layer 150, so that a bridge wiring can connect the wirings in the first direction with the wirings in the second direction of the first touch wiring layer 140 through the contact hole.

Specifically, since the second insulating layer 170 provides a flat surface under the first touch wiring layer 140 and the second touch wiring layer 160, the touch unit 130 and the light-emitting element unit 210 can be easily attached together by the adhesive layer 300.

The second insulating layer 170 includes openings 172 and 172' via which portions of the edges of the first insulating layer 150 are exposed to the adhesive layer 300. In other words, the first insulating layer 150 can protrude from the second insulating layer 170. Also, the adhesive layer 300 can have a portion that extends to contact the first insulating layer 150. The portion of the adhesive layer 300 can have an edge that can be aligned with the edge of the first insulating layer 150. The openings 172 and 172' can be formed using a mask, in order to suppress overflowing of the material of the adhesive layer 300 during the process of attaching the first flexible substrate 120 and the second flexible substrate 200 together. For example, the openings 172 and 172' can have such a depth and a width that they can accommodate a part of the adhesive layer 300 that can overflow. The openings 172 and 172' of the second insulating layer 170 can be aligned with the edges of the first insulating layer 150. Referring to FIG. 1, the openings 172 and 172' can be formed in the form of chamfer in consideration of the position of the pad PAD for testing, for example, the foldable display device 100.

The adhesive layer 300 disposed under the second insulating layer 170 can be made of a thermosetting or UV curing resin. The part of the adhesive layer 300 exposed via the openings 172 and 172' are cut at the boundary of the first flexible substrate 120 by a laser during a laser release process, together with the first insulating layer 150 and the second insulating layer 170. As a result, the foldable display device 100 can be neatly cut as shown in FIG. 2. Thus, according to the example embodiment of the present disclosure, it is ensured that the adhesive layer does not spread beyond the portion to be cut by a laser, so that a rigid substrate can be separated easily, thereby manufacturing a foldable display device reliably with reduced defects due to breakage. Further, according to the example embodiment of the present disclosure, it is ensured that the adhesive layer is restricted as desired, so that it is possible to avoid breakage at a portion where the adhesive is not formed during the process of cutting by the laser, and to suppress defects that a part of the touch unit is exposed.

Referring to FIG. 3, the light-emitting element unit 210 includes a buffer layer 211, a thin-film transistor 220 for driving a light-emitting element EL, a gate insulating layer 212 of the thin-film transistor 220, an interlayer dielectric layer 230, a passivation layer 240, a planarization layer 250, an anode 260, a bank 270, a light-emitting element EL, a cathode 280, and an encapsulation layer 290.

A buffer layer 211 can be formed on the entire surface of the second flexible substrate 200. The buffer layer 211 can be made up of a single layer of silicon nitride or silicon oxide, or multiple layers of silicon nitride (SiNx) and silicon oxide (SiOx). The buffer layer 211 enhances the adhesion between the layers formed thereon and the substrate 200, and blocks alkaline components or the like leaking out of the substrate 200. It is to be understood that the buffer layer 211 is not an essential element and can be eliminated depending on the type and material of the substrate 200, the structure and type of the thin-film transistor, etc.

The thin-film transistor 220 can be disposed on the buffer layer 211. The thin-film transistor 220 includes an activate layer 222, a gate electrode 221, a source electrode 223, and a drain electrode 224.

The gate insulating layer 212 can be disposed on the buffer layer 211 and the active layer 222. The gate insulating layer 212 can be made up of a single layer of silicon nitride (SiNx) or silicon oxide (SiOx), or multiple layers of silicon nitride (SiNx) and silicon oxide (SiOx). Contact holes are formed in the gate insulating layer 212, via which the source electrode 223 and the drain electrode 224 of the thin-film transistor 220 comes in contact with the source region and the drain region of the active layer 222, respectively.

The gate electrode 221 can be disposed on the gate insulating layer 212. The interlayer dielectric layer 230 can be disposed on the gate electrode 221. The interlayer dielectric layer 230 can be made of silicon nitride (SiNx). The contact holes are formed in the interlayer dielectric layer 230, via which the source region and the drain region of the active layer 222 are exposed.

The source electrode 223 of the thin-film transistor 220 can be formed above the gate electrode 221, and the drain electrode 224 thereof can be formed above the active layer 222 and the gate electrode 221, to be connected to the anode electrode 260. It is, however, to be understood that the present disclosure is not limited thereto. Other variations are possible. The cathode electrode 280 can be connected to the drain electrode 224.

The source electrode 223 and the drain electrode 224 are connected to the source region and the drain region of the active layer 222 through the contact holes formed in the gate insulating layer 212 and the interlayer dielectric layer 230, respectively. Each of the source electrode 223 and the drain electrode 224 can be made up of a triple-layer of titanium (Ti) and aluminum (Al). For example, the top and bottom layers of each of the source electrode 223 and the drain electrode 224 can be made of titanium (Ti), and the intermediate layer therebetween can be made of aluminum (Al), to form a triple-layer of titanium (Ti)/aluminum (Al)/titanium (Ti). It is, however, to be understood that the present disclosure is not limited thereto. Other variations are possible. Each of the source electrode 223 and the drain electrode 224 can be made up of a single layer or a double-layer.

The passivation layer 240 can be formed over the thin-film transistor 220. The passivation layer 240 can be an insulating layer for protecting the thin-film transistor 220. A contact hole can be formed in the passivation layer 240 via which the drain electrode 224 of the thin-film transistor 220 can be exposed.

The planarization layer 250 can be disposed on the passivation layer 240. The planarization layer 250 can be an insulating layer for providing a flat surface over the thin-film transistor 220 and can be made of an organic material. The contact hole can be formed in the planarization layer 250 via which the drain electrode 224 of the thin-film transistor 220 can be exposed. It is to be understood that the passivation layer 240 is not an essential element and can be eliminated depending on the type and material of the substrate, the structure and type of the thin-film transistor, etc.

The anode 260 can be disposed on the planarization layer 250. The anode 260 can be electrically connected to the drain electrode 224 of the thin-film transistor 220 through the contact hole formed in the passivation layer 240 and the planarization layer 250. The anode 260 can include a reflective layer for reflecting light emitted from the light-emitting element EL and a transparent conductive layer for supplying holes to the light-emitting element EL.

The bank 270 made of an organic material can be disposed over the anode 260 and the planarization layer 250, and the light-emitting element EL can be disposed on the bank 270 and the anode 260. The cathode 280 can be disposed over the light-emitting element EL. It is, however, to be understood that the present disclosure is not limited thereto. Other variations are possible. If the cathode 280 can be disposed on the planarization layer 250 and the cathode 280 can be electrically connected to the drain electrode 224 of the thin-film transistor 220 through the contact hole formed in the planarization layer 250, the anode 260 can be disposed on the light-emitting element EL.

The encapsulation layer 290 can be formed on the entire surface of the cathode 280 to protect the light-emitting element EL from exposure to moisture, which can be vulnerable to moisture.

Figure 4:
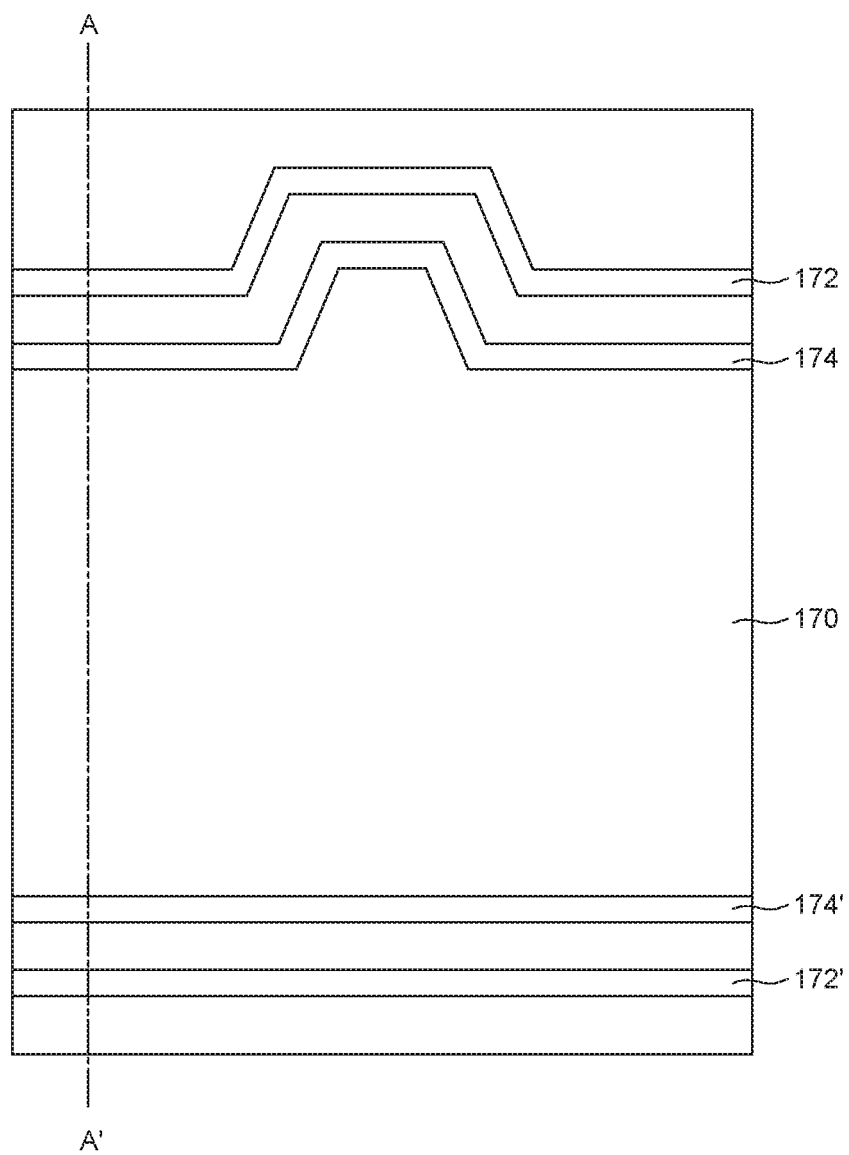
FIG. 4 is a plan view of a touch unit of a foldable display device according to another example embodiment of the present disclosure.
Figure 5:
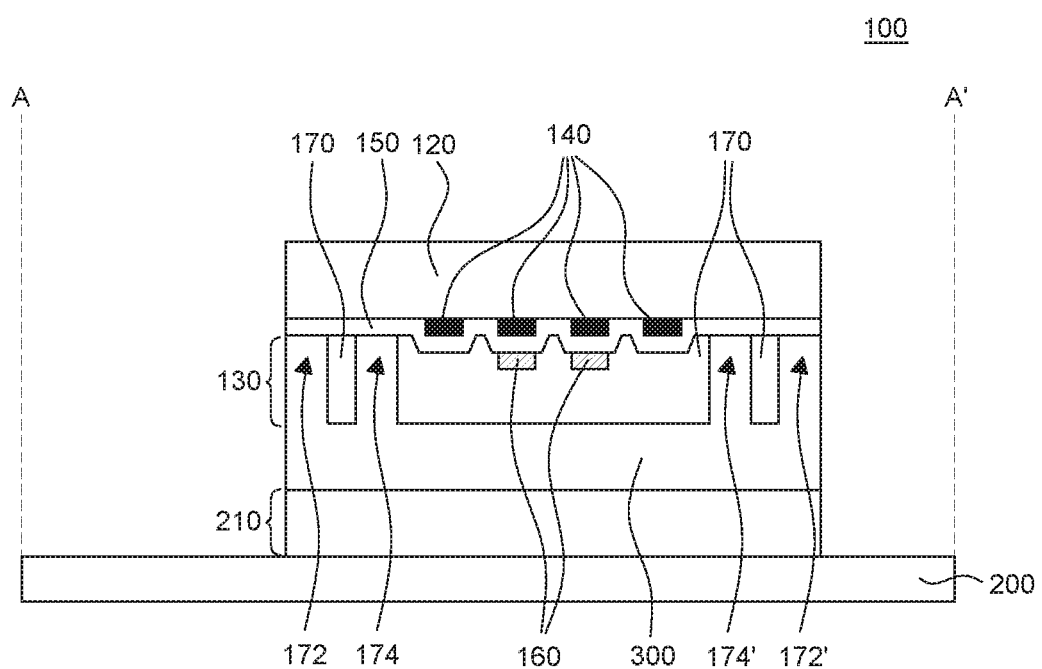
FIG. 5 is a cross-sectional view of a touch unit of a foldable display device according to another example embodiment of the present disclosure, taken along line A-A' of FIG. 4.

FIG. 4 is a plan view of a touch unit of a foldable display device according to another example embodiment of the present disclosure. FIG. 5 is a cross-sectional view of a touch unit of a foldable display device according to another example embodiment of the present disclosure, taken along line A-A' of FIG. 4.

Referring to FIGS. 4 and 5, a second insulating layer 170 of a foldable display device 100 can include more openings 172, 172', 174 and 174' than the openings 172 and 172' formed in the second insulating layer 170 shown in FIGS. 1 and 2. In this example, when the first flexible substrate 120 and the second flexible substrate 200 are attached together during the process of manufacturing the foldable display device 100, a part of the adhesive applied onto the first flexible substrate 120 and the touch unit 130 can be accommodated into the openings 172, 172', 174 and 174'. As the number of the openings increases, a greater amount of the adhesive can be accommodated into the openings, so that the overflowing of the adhesive layer 300 can be more easily suppressed. The number of the openings can be determined based on a margin of the second insulating layer 170.

Figure 6:
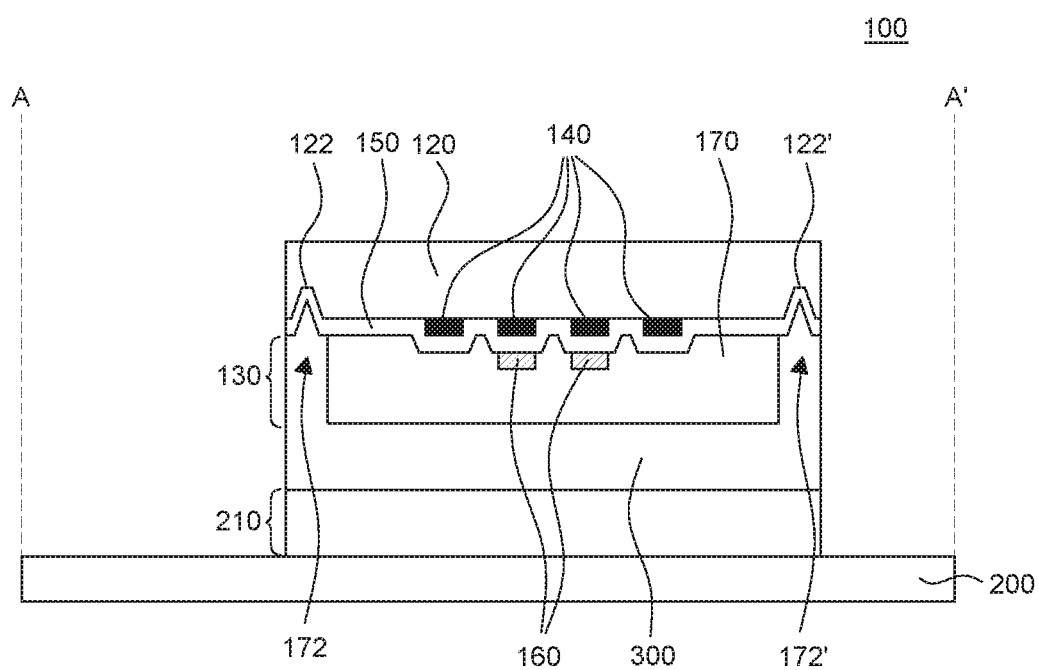
FIG. 6 is a cross-sectional view of a foldable display device according to another example embodiment of the present disclosure.

FIG. 6 is a cross-sectional view of a foldable display device according to another example embodiment of the present disclosure. Referring to FIG. 6, a first flexible substrate 120 can have slits 122 and 122' on its edges. A first touch wiring layer 140 can be disposed under the first flexible substrate 120 having the slits 122 and 122' formed therein. A first insulating layer 150 can be disposed under the first flexible substrate 120 and the first touch wiring layer 140 to cover them. The first insulating layer 150 can be disposed along the slits 122 and 122'. In other words, the first insulating layer 150 can cover the slits 122 and 122'. A second touch wiring layer 160 can be disposed under the first insulating layer 150. A second insulating layer 170 covering the second touch wiring layer 160 and the first insulating layer 150 can be disposed under the second touch wiring layer 160. The second insulating layer 170 includes openings 172 and 172' via which portions of the edges of the first insulating layer 150 are exposed to the adhesive layer 300. The openings 172 and 172' can be disposed in line with the slits 122 and 122', respectively. The width of the openings 172 and 172' can be greater than the width of the slits 122 and 122'. Therefore, when the first flexible substrate 120 and the second flexible substrate 200 are attached together, the adhesive can easily permeate into the slits. For example, the slits 122 and 122' and the openings 172 and 172' can have such a height (depth) and a width that they can accommodate a part of the adhesive layer 300 that can overflow.

Figure 7:
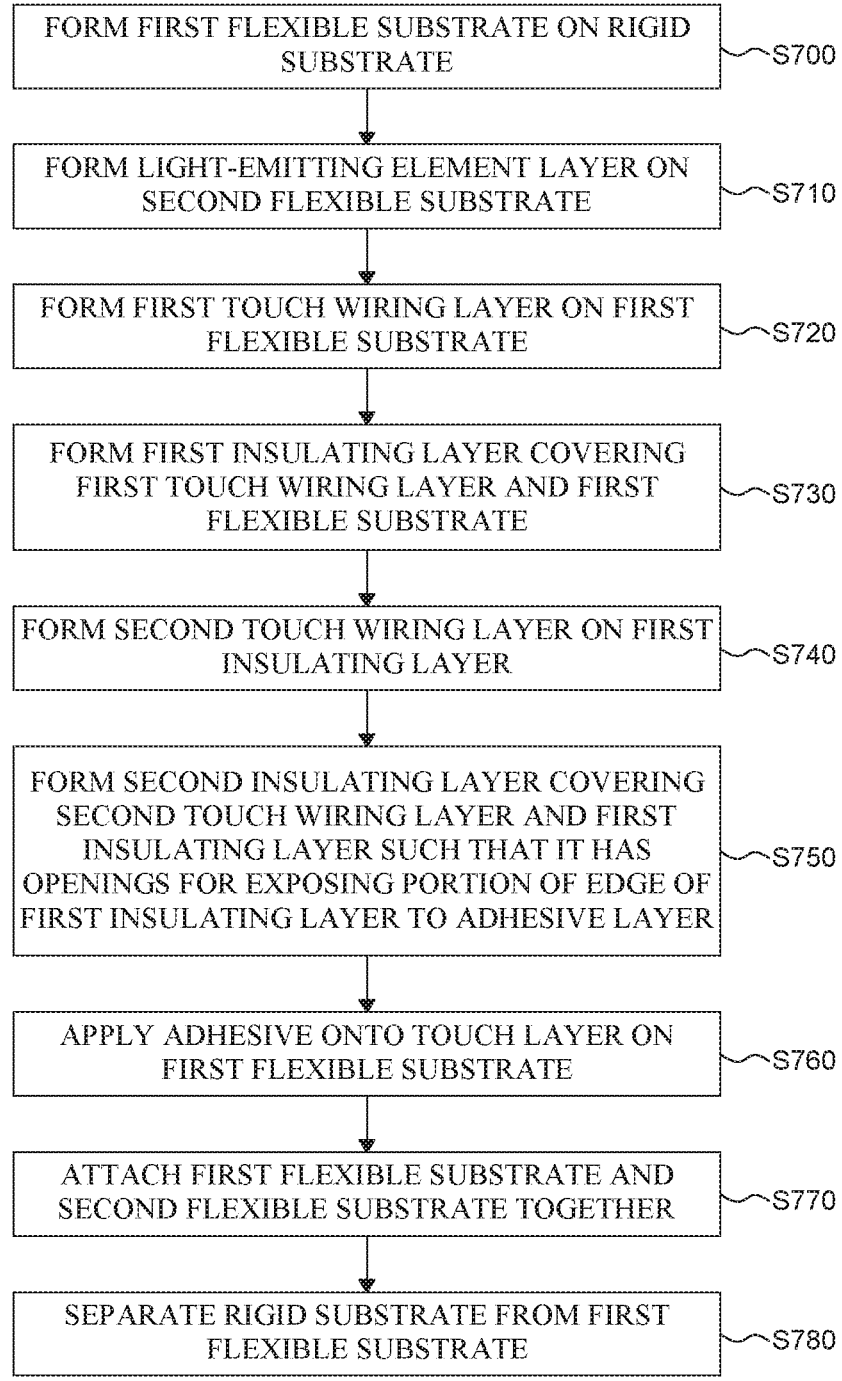
FIG. 7 is a flowchart for illustrating a method of manufacturing a foldable display device according to an example embodiment of the present disclosure.

FIG. 7 is a flowchart for illustrating a method of manufacturing a foldable display device according to an example embodiment of the present disclosure. FIGS. 8A, 8B, 8C, 8D, 8E, 8F and 8G are cross-sectional views showing processing operations of the method of manufacturing a foldable display device according to the example embodiment of the present disclosure.

Figure 8A:
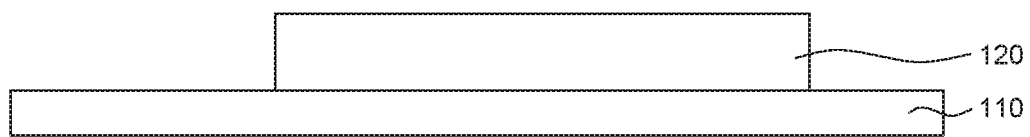
FIGS. 8A, 8B, 8C, 8D, 8E, 8F and 8G are cross-sectional views showing processing operations of the method of manufacturing a foldable display device according to the example embodiment of the present disclosure.
Figure 8B:
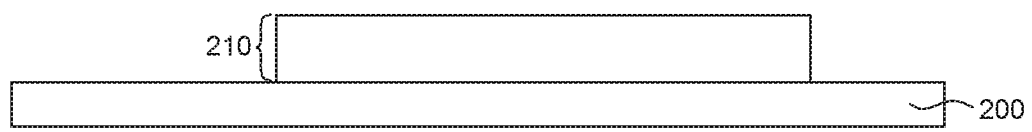

Referring to FIGS. 7, 8A and 8B, a first flexible substrate 120 can be formed on a rigid substrate 110 (operation S700), and a light-emitting element unit 210 can be formed on a second flexible substrate 200 (operation S710). The rigid substrate 110 can be attached to the first flexible substrate 120 to support various elements of the touch unit 130 during the process, and can be made of a rigid material such as glass and reinforced plastic.

Figure 8C:
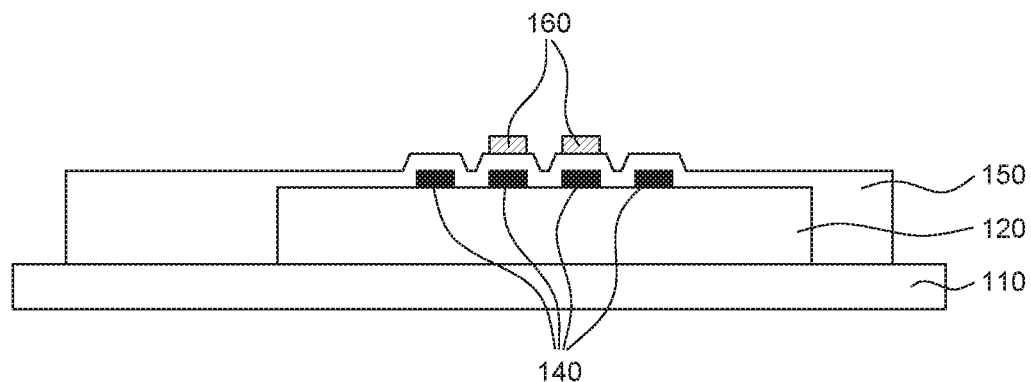

Referring to FIG. 8C, a first touch wiring layer 140 can be formed on the first flexible substrate 120 (operation S720), and a first insulating layer 150 covering the first touch wiring layer 140 and the first flexible substrate 120 can be formed (operation S730). A second touch wiring layer 160 can be formed on the first insulating layer 150 (operation S740).

Figure 8D:
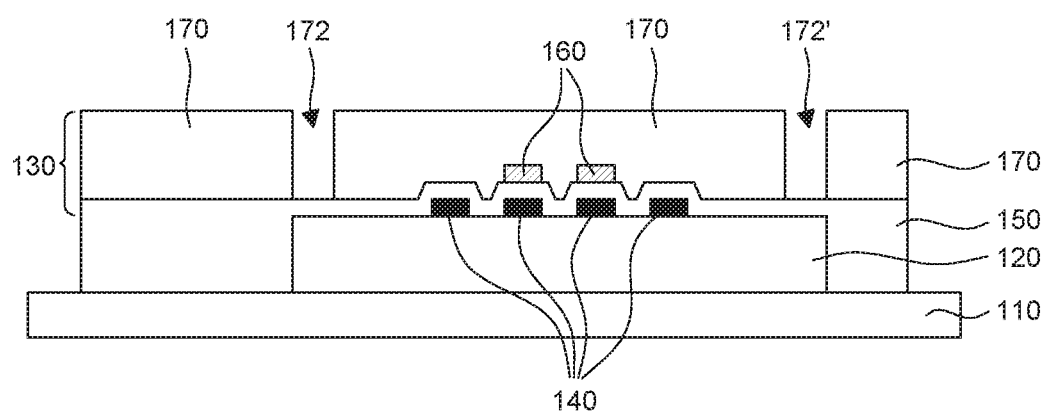

Referring to FIG. 8D, the second insulating layer 170 covering the second touch wiring layer 160 and the first insulating layer 150 can be formed such that it has openings 172 and 172' for exposing parts of the edges of the first insulating layer 150 to the adhesive layer (operation S750). The openings 172 and 172' can be formed via a deposition process using a mask having regions corresponding to the openings 172 and 172'.

Figure 8E:
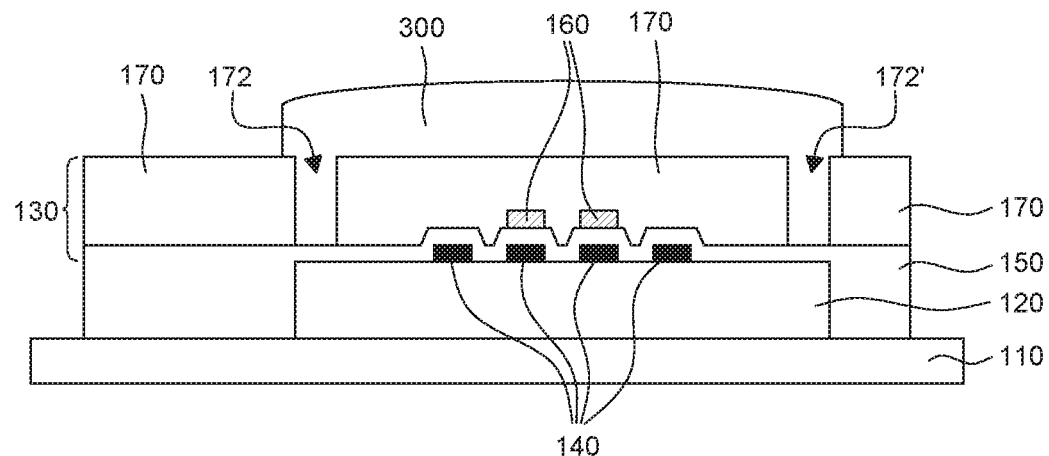
Figure 8F:
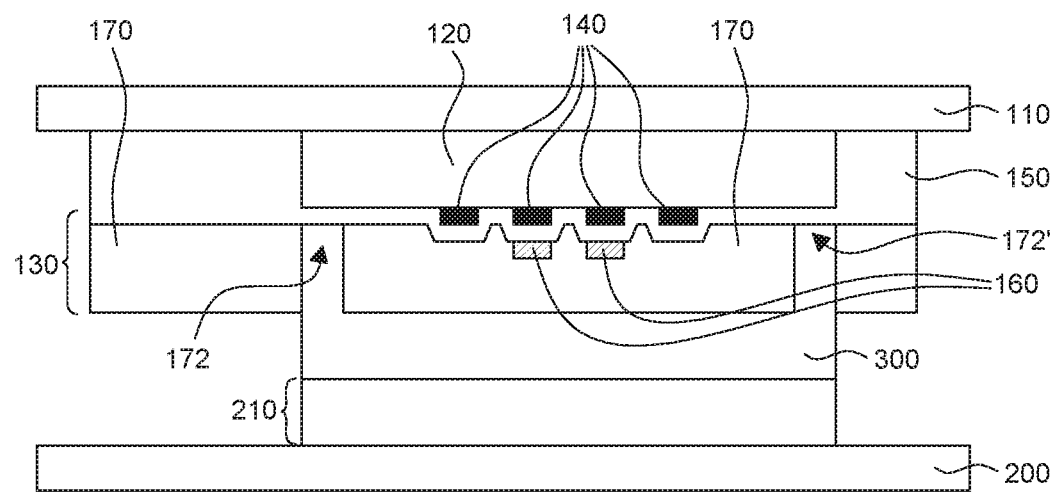
Figure 8G:
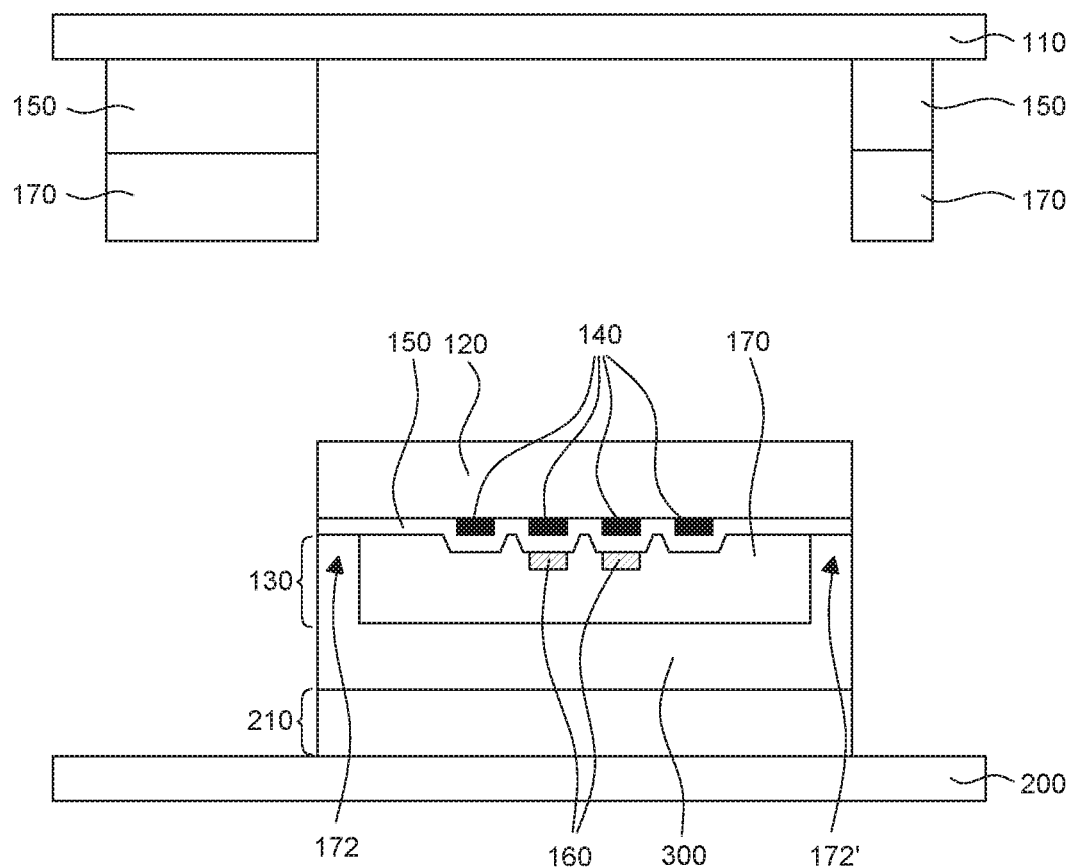

Referring to FIG. 8E, an adhesive 300 can be applied onto the touch unit 130 of the first flexible substrate 120 (operation S760). Since a part of the adhesive 300 can be accommodated into the openings 172 and 172' formed in the second insulating layer 170, the adhesive 300 can easily spread to the boundary where the first insulating layer 150 and the second insulating layer 170 are cut by a laser during the laser release process. Thus, according to the example embodiment of the present disclosure, it is ensured that the adhesive does not spread beyond the portion to be cut by a laser, so that a rigid substrate can be separated easily, thereby manufacturing a foldable display device reliably with reduced defects due to breakage. Further, according to the example embodiment of the present disclosure, it is ensured that the adhesive layer is restricted as desired, so that it is possible to avoid breakage at a portion where the adhesive is not formed during the process of cutting by a laser, and to suppress defects that a part of the touch unit is exposed Referring to FIGS. 8F and 8G, the first flexible substrate 120 and the second flexible substrate 200 are attached together (operation S770), and the rigid substrate 110 can be separated from the first flexible substrate 120 (operation S780). The first insulating layer 150, the second insulating layer 170 and the part of the adhesive layer exposed via the openings 172 and 172' are cut at the boundary of the first flexible substrate 120 during the laser release process. Accordingly, the foldable display device 100 can be cut neatly as shown in FIG. 8G.

The example embodiments of the present disclosure can also be described as follows:

According to an aspect of the present disclosure, there is provided a foldable display device. The foldable display device comprises a first flexible substrate; a touch unit disposed under the first flexible substrate; a second flexible substrate facing the first flexible substrate; a light-emitting element unit disposed on the second flexible substrate; and an adhesive layer configured to attach the first flexible substrate and the second flexible substrate together, wherein the touch unit comprises a first touch wiring layer disposed under the first flexible substrate, a first insulating layer configured to cover the first touch wiring layer and the first flexible substrate, a second touch wiring layer disposed under the first insulating layer, and a second insulating layer configured to cover the second touch wiring layer and the first insulating layer, and wherein the second insulating layer comprises an opening via which a part of an edge of the first insulating layer is exposed to the adhesive layer.

The second insulating layer can comprise a plurality of openings, and wherein the number of the openings is determined based on a margin of the second insulating layer.

The first flexible substrate can have slits on its edges.

The openings can be in line with the slits, respectively.

The first insulating layer can be disposed along the slits of the first flexible substrate. The foldable display device can further comprise a pad disposed outside the first flexible substrate. An upper surface of the pad can have the same level as an upper surface of the first flexible substrate.

The openings can be formed in a form of chamfer in consideration of the position of the pad.

According to another aspect of the present disclosure, there is provided a method of manufacturing a foldable display device. The method of manufacturing a foldable display device comprises forming a first flexible substrate on a rigid substrate; forming a touch unit on the first flexible substrate; forming a light-emitting element unit on a second flexible substrate; applying an adhesive over the touch unit on the first flexible substrate; attaching the first flexible substrate and the second flexible substrate together; and separating the rigid substrate from the first flexible substrate, wherein the forming the touch unit comprises forming a first touch wiring layer on the first flexible substrate, forming a first insulating layer covering the first touch wiring layer and the first flexible substrate, forming a second touch wiring layer on the first insulating layer, and forming a second insulating layer covering the second touch wiring layer and the first insulating layer such that the second insulating layer has an opening via which a part of an edge of the first insulating layer is exposed to the adhesive layer.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A foldable display device comprising:
a first flexible substrate;
a touch unit disposed under the first flexible substrate;
a second flexible substrate facing the first flexible substrate;
a light-emitting element unit disposed on the second flexible substrate; and
an adhesive layer configured to attach the first flexible substrate and the second flexible substrate together, wherein the touch unit comprises a first touch wiring layer disposed under the first flexible substrate, a first insulating layer configured to cover the first touch wiring layer and the first flexible substrate, a second touch wiring layer disposed under the first insulating layer, and a second insulating layer configured to cover the second touch wiring layer and the first insulating layer, and wherein the second insulating layer comprises an opening via which a part of an edge of the first insulating layer is exposed to the adhesive layer.

2. The foldable display device of claim 1, wherein the second insulating layer comprises a plurality of openings, and wherein the number of the plurality of openings is based on a margin of the second insulating layer.

3. The foldable display device of claim 1, wherein the first flexible substrate has slits on its edges.

4. The foldable display device of claim 3, wherein the plurality of openings are in line with the slits, respectively.

5. The foldable display device of claim 4, wherein the first insulating layer is disposed along the slits of the first flexible substrate.

6. The foldable display device of claim 4, wherein a width of the plurality of openings is greater than a width of the slits.

7. The foldable display device of claim 1, further comprising: a pad disposed outside the first flexible substrate, wherein an upper surface of the pad has the same level as an upper surface of the first flexible substrate.

8. The foldable display device of claim 7, wherein the plurality of openings are formed in a form of a chamfer in consideration of a position of the pad.

9. The foldable display device of claim 1, wherein the opening of the second insulating layer has an outer edge that is aligned with the edge of the first insulating layer.

10. The foldable display device of claim 1, wherein the adhesive layer has a portion that extends to contact the first insulating layer.

11. A method of manufacturing a foldable display device, the method comprising:
  forming a first flexible substrate on a rigid substrate;
  forming a touch unit on the first flexible substrate;
  forming a light-emitting element unit on a second flexible substrate;
  applying an adhesive over the touch unit on the first flexible substrate;
  attaching the first flexible substrate and the second flexible substrate together; and
  separating the rigid substrate from the first flexible substrate,
  wherein the forming the touch unit comprises:
  forming a first touch wiring layer on the first flexible substrate,
  forming a first insulating layer covering the first touch wiring layer and the first flexible substrate,
  forming a second touch wiring layer on the first insulating layer, and
  forming a second insulating layer covering the second touch wiring layer and the first insulating layer such that the second insulating layer has an opening via which a part of an edge of the first insulating layer is exposed to the adhesive layer.

12. The method of claim 11, wherein the opening of the second insulating layer is formed by a deposition process using a mask having regions corresponding to the opening.

13. The method of claim 11, wherein the opening of the second insulating layer is formed to have an outer edge that is aligned with the edge of the first insulating layer.

14. A foldable display device comprising:
  a touch unit;
  a light-emitting element unit; and
  an adhesive layer disposed between the touch unit and the light-emitting element unit to attach the touch unit and the light-emitting element unit together,
  wherein the touch unit comprises a first touch wiring layer, a first insulating layer to cover the first touch wiring layer, a second touch wiring layer disposed on the first insulating layer, and a second insulating layer to cover the second touch wiring layer and the first insulating layer, and
  wherein the adhesive layer has a portion that extends to contact the first insulating layer.

15. The foldable display device of claim 14, wherein the second insulating layer comprises an opening which a part of an edge of the first insulating layer is exposed to the adhesive layer.

16. The foldable display device of claim 15, wherein the portion of the adhesive layer extends in the opening to contact the first insulating layer.

17. The foldable display device of claim 15, wherein the opening of the second insulating layer has an outer edge that is aligned with the edge of the first insulating layer.

18. The foldable display device of claim 15, wherein the opening comprises a plurality of openings, and the portion of the adhesive layer comprises a plurality of portions, and
  wherein the plurality of portions respectively extend in the plurality of openings.

19. The foldable display device of claim 14, further comprising:
  a first flexible substrate on which the touch unit is disposed; and
  a second flexible substrate on which the light-emitting element unit is disposed, the second flexible substrate facing the first flexible substrate.

20. The foldable display device of claim 14, wherein the portion of the adhesive layer has an edge that is aligned with the edge of the first insulating layer.

* * * * *